US011488822B2

(12) United States Patent
Gardner et al.

(10) Patent No.: US 11,488,822 B2
(45) Date of Patent: Nov. 1, 2022

(54) SAG NANOWIRE GROWTH WITH ION IMPLANTATION

(71) Applicant: Microsoft Technology Licensing, LLC, Redmond, WA (US)

(72) Inventors: Geoffrey C. Gardner, West Lafayette, IN (US); Sergei V. Gronin, West Lafayette, IN (US); Raymond L. Kallaher, West Lafayette, IN (US); Michael James Manfra, West Lafayette, IN (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/887,635

(22) Filed: May 29, 2020

(65) Prior Publication Data

US 2021/0375624 A1    Dec. 2, 2021

(51) Int. Cl.
*H01L 29/40* (2006.01)
*H01L 21/4763* (2006.01)
(Continued)

(52) U.S. Cl.
CPC .. *H01L 21/02603* (2013.01); *H01L 21/02636* (2013.01); *H01L 21/265* (2013.01); *H01L 29/0669* (2013.01)

(58) Field of Classification Search
CPC .................. H01L 21/02603; H01L 29/0669
(Continued)

(56) References Cited

U.S. PATENT DOCUMENTS 6,576,518 B1 * 6/2003 Yamada ................ H01L 27/112
                                                        438/275
7,829,416 B2 * 11/2010 Kudou .............. H01L 29/41741
                                                        438/268

(Continued)

FOREIGN PATENT DOCUMENTS

WO    2018125081 A1    7/2018
WO    2019074557 A1    4/2019

OTHER PUBLICATIONS

Jiao, et al., "Studying of Linearly Graded Buffer Layer Effect on Quality of InGaAs on GaAs Substrate", In 6th International Symposium on Advanced Optical Manufacturing and Testing Technologies: Optoelectronic Materials and Devices for Sensing, Imaging, and Solar Energy, vol. 8419, Oct. 15, 2012, 7 Pages.

(Continued)

*Primary Examiner* — Calvin Lee
(74) *Attorney, Agent, or Firm* — Withrow & Terranova, PLLC

(57) ABSTRACT

The present disclosure relates to a nanowire structure, which includes a substrate with a substrate body and an ion implantation region, a patterned mask with an opening over the substrate, and a nanowire. Herein, the substrate body is formed of a conducting material, and the ion implantation region that extends from a top surface of the substrate body into the substrate body is electrically insulating. A surface portion of the substrate body is exposed through the opening of the patterned mask, while the ion implantation region is fully covered by the patterned mask. The nanowire is directly formed over the exposed surface portion of the substrate body and is not in contact with the ion implantation region. Furthermore, the nanowire is confined within the ion implantation region, such that the ion implantation region is (Continued)

Figure 1A:
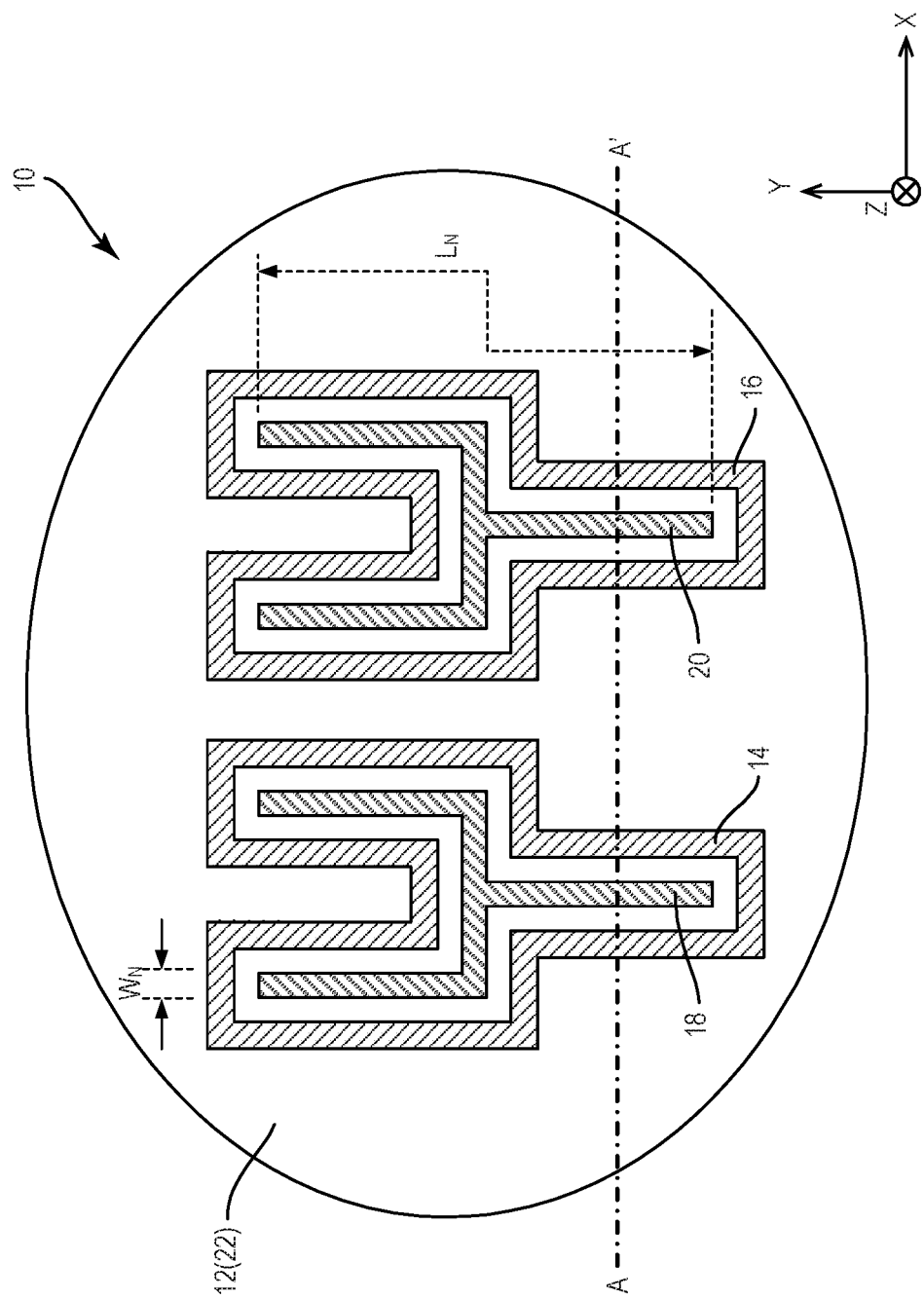

configured to provide a conductivity barrier of the nanowire in the substrate.

14 Claims, 7 Drawing Sheets

(51) Int. Cl.
  *H01L 21/02*    (2006.01)
  *H01L 21/265*   (2006.01)
  *H01L 29/06*    (2006.01)

(58) Field of Classification Search
  USPC .......................... 438/611–617; 257/784–786
  See application file for complete search history.

(56) References Cited

U.S. PATENT DOCUMENTS

| | | | |
|---|---|---|---|
| 9,472,468 B2 * | 10/2016 | van Dal | H01L 27/1104 |
| 10,629,798 B1 | 4/2020 | Kallaher et al. | |
| 10,978,632 B2 * | 4/2021 | Kallaher | H01L 39/228 |
| 2005/0142804 A1 | 6/2005 | Shin | |
| 2008/0258132 A1 | 10/2008 | Liu et al. | |
| 2011/0117740 A1 | 5/2011 | Martinez et al. | |
| 2013/0099283 A1 | 4/2013 | Lin et al. | |
| 2015/0228730 A1 | 8/2015 | Yang et al. | |
| 2017/0054021 A1 | 2/2017 | Kunert et al. | |
| 2018/0358436 A1 | 12/2018 | Jambunathan et al. | |
| 2021/0210599 A1 | 7/2021 | Gardner et al. | |
| 2021/0375623 A1 | 12/2021 | Gardner et al. | |

OTHER PUBLICATIONS

"International Search Report and Written Opinion Issued in PCT Application No. PCT/US20/065023", dated Mar. 23, 2021, 32 Pages.

Zhang, et al., "The Effect of Buffer Types on the In0.82Ga0.18As Epitaxial Layer Grown on an InP (100) Substrate", In Journal of Materials, vol. 11, Issue 6, Jun. 8, 2018, pp. 1-11.

Krishnan, M., et al., "Chemical Mechanical Planarization: Slurry Chemistry, Materials, and Mechanisms," Chemical Reviews, vol. 110, No. 1, 2010, American Chemical Society, pp. 178-204.

Muessig, B.H. et al., "Selective high-temperature-stable oxygen implantation and MBE-overgrowth technique," Gallium Arsenide and Related Compounds 1993, Proceedings of the 20th International Symposium on Gallium Arsenide and Related Compounds, Frieburg, Germany, Aug. 29-Sep. 2, 1993, Institute of Physics Conference Series No. 136, Institute of Physics Publishing, pp. 529-534.

Pearton, S.J., "Ion Implantation for Isolation of III-V Semiconductors," Materials Science Reports, vol. 4, 1990, pp. 313-363.

Vaitiekenas, S., et al., "Selective Area Grown Semiconductor-Superconductor Hybrids: A Basis for Topological Networks," Physical Review Letters, vol. 121, No. 14, 2018, 8 pages.

Zhou, Y., et al., "Characterization of sapphire chemical mechanical polishing performances using silica with different sizes and their removal mechanisms," Colloids and Surfaces A: Physicochemical and Engineering Aspects, vol. 513, Jan. 2017, Elsevier B.V., pp. 153-159.

"International Search Report and Written Opinion Issued in PCT Application No. PCT/US2021/020464", dated Jun. 16, 2021, 11 Pages.

"International Search Report and Written Opinion Issued in PCT Application No. PCT/US2021/020474", dated Jun. 11, 2021, 24 Pages.

"Non Final Office Action Issued in U.S. Appl. No. 16/736,930", dated Oct. 28, 2021, 8 Pages.

"Non Final Office Action Issued in U.S. Appl. No. 16/887,480", dated Feb. 9, 2022, 14 Pages.

"Non Final Office Action Issued in U.S. Appl. No. 16/736,930", dated Apr. 28, 2022, 8 Pages.

"Final Office Action Issued in U.S. Appl. No. 16/887,480", dated Jul. 26, 2022, 11 Pages.

"Final Office Action Issued in U.S. Appl. No. 16/736,930", dated Aug. 1, 2022, 11 Pages.

* cited by examiner

SAG NANOWIRE GROWTH WITH ION IMPLANTATION

FIELD OF THE DISCLOSURE

The present disclosure relates to a selective-area-growth (SAG) nanowire structure and a process for making the same, and in particular to a SAG nanowire structure with an ion implanted substrate and a process for manufacturing the SAG nanowire structure with ion implantation.

BACKGROUND

Nanowires show great promise for applications in quantum computing. Unfortunately, it is difficult to manufacture high quality nanowires. Conventional processes for manufacturing nanowires include selective-area-growth (SAG) wherein nanowires are selectively grown on a substrate. To function properly, nanowires must be a conducting semiconductor material, and the substrate on which the nanowires are grown often is an insulating material. As such, the nanowires grown on the same substrate are enabled for isolation from each other. However, there is often a large difference in the crystal lattice constant of the substrate and the nanowires to be grown via SAG. This crystal lattice mismatch causes crystalline defects in the nanowires during growth such as dislocations and stacking faults. The crystalline defects can penetrate the nanowires and in turn decrease the performance of the resulting nanowires.

Accordingly, there is a need for a nanowire structure with reduced crystalline defects and methods of manufacturing the same.

SUMMARY

The present disclosure relates to a nanowire structure and a process for making the same. The disclosed nanowire structure includes a substrate with a substrate body and an ion implantation region, a patterned mask with an opening over the substrate, and a nanowire. Herein, the substrate body is formed of a conducting material, while the ion implantation region that extends from a top surface of the substrate body into the substrate body is electrically insulating. A surface portion of the top surface of the substrate body is exposed through the opening of the patterned mask, and the ion implantation region is fully covered by the patterned mask. The nanowire is directly formed over the exposed surface portion of the substrate body through the opening of the patterned mask, and is not in contact with the ion implantation region. Furthermore, the nanowire is confined within the ion implantation region, such that the ion implantation region is configured to provide a conductivity barrier of the nanowire in the substrate.

In one embodiment of the nanowire structure, the ion implantation region has a closed-loop shape.

In one embodiment of the nanowire structure, the substrate body has a thickness between 50 μm and 1000 μm, and the ion implantation region has a depth between 2 nm and 50 μm.

In one embodiment of the nanowire structure, the substrate body is formed of one of indium arsenide, indium antimonide, gallium antimonide, and indium gallium arsenide, and the nanowire is formed of one of indium arsenide, indium antimonide, and indium arsenide antimonide.

According to another embodiment, the nanowire structure further includes a superconductor layer formed over the nanowire.

According to another embodiment, an alternative nanowire structure includes a substrate with a substrate body and at least one ion implantation region, a patterned mask with a first opening and a second opening over the substrate, a first nanowire, and a second nanowire. Herein, the substrate body is formed of a conducting material, while the at least one ion implantation that extends from a top surface of the substrate body into the substrate body is electrically insulating. A first surface portion of the top surface of the substrate body is exposed through the first opening of the patterned mask, a second surface portion of the top surface of the substrate body is exposed through the second opening of the patterned mask, and the at least one ion implantation region is fully covered by the patterned mask. The first nanowire is formed directly over the exposed first surface portion of the substrate body through the first opening of the patterned mask. The second nanowire is formed directly over the exposed second surface portion of the substrate body through the second opening of the patterned mask. The first nanowire and the second nanowire are not in contact with the at least one ion implantation region. A portion of the at least one ion implantation region is between the first nanowire and the second nanowire, so as to break a conducting path within the substrate between the first nanowire and the second nanowire.

In one embodiment of the alternative nanowire structure, the at least one ion implantation region includes a first ion implantation region and a second ion implantation region. Herein, the first nanowire is confined within the first ion implantation region, such that the first ion implantation region is configured to provide a conductivity barrier of the first nanowire. The second nanowire is confined within the second ion implantation region, such that the second ion implantation region is configured to provide a conductivity barrier of the second nanowire. A portion of the first ion implantation region and a portion of the second ion implantation region are positioned between the first nanowire and the second nanowire.

In one embodiment of the alternative nanowire structure, the first ion implantation region has a closed-loop shape and the second ion implantation region has a closed-loop shape.

In one embodiment of the alternative nanowire structure, the first ion implantation region and the second ion implantation region have different shapes.

In one embodiment of the alternative nanowire structure, a depth of the first ion implantation region and a depth of the second ion implantation region are different.

According to another embodiment, the alternative nanowire structure further includes a first superconductor layer formed over the first nanowire and a second superconductor layer formed over the second nanowire. Herein, the first superconductor layer and the second superconductor layer are not connected.

In one embodiment of the alternative nanowire structure, the substrate body has a thickness between 50 μm and 1000 μm. The first ion implantation region has a depth between 2 nm and 50 μm, and the second ion implantation region has a depth between 2 nm and 50 μm.

In one embodiment of the alternative nanowire structure, the substrate body has a thickness between 50 μm and 1000 μm, and the at least one ion implantation region has a depth between 2 nm and 50 μm.

In one embodiment of the alternative nanowire structure, the substrate body is formed of one of indium arsenide, indium antimonide, gallium antimonide, and indium gallium arsenide, and the at least one nanowire is formed of one of indium arsenide, indium antimonide, and indium arsenide antimonide.

According to an exemplary process for manufacturing a nanowire structure, a substrate body formed of a conducting material is provided at a beginning. An implantation mask with an implantation opening is then provided over the substrate body. A processing surface portion of a top surface of the substrate body is exposed through the implantation opening of the implantation mask. Next, ion implantation is applied to the substrate body through the implantation opening, such that a portion of the substrate body, which extends from the exposed processing surface portion into the substrate body, is converted to an ion implantation region. The ion implantation region is electrically insulating. After the ion implantation region is formed, the implantation mask is removed. A patterned mask with a nanowire opening is provided over the substrate body and the ion implantation region. A nanowire surface portion of the top surface of the substrate body is exposed through the nanowire opening of the patterned mask, and the ion implantation region is fully covered by the patterned mask. Finally, a nanowire is formed over the exposed nanowire surface portion of the substrate body through the nanowire opening of the patterned mask. Herein, the nanowire is not in contact with the ion implantation region. The nanowire is confined within the ion implantation region, such that the ion implantation region is configured to provide a conductivity barrier of the nanowire in the substrate.

In one embodiment of the exemplary process, the ion implantation is applied by implanting oxygen ions into the substrate body through the implantation opening.

In one embodiment of the exemplary process, the substrate is formed of one of indium phosphide, gallium antimonide, and gallium arsenide, and the nanowire is formed of one of indium arsenide, indium antimonide, and indium arsenide antimonide.

In one embodiment of the exemplary process, the substrate body has a thickness between 50 µm and 1000 µm, and the ion implantation region has a depth between 2 nm and 50 µm.

According to another embodiment, the exemplary process further includes providing a superconductor layer on the nanowire.

According to another embodiment, the exemplary process further includes planarizing the top surface of substrate body after removing the implantation mask and before providing the patterned mask.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1B:
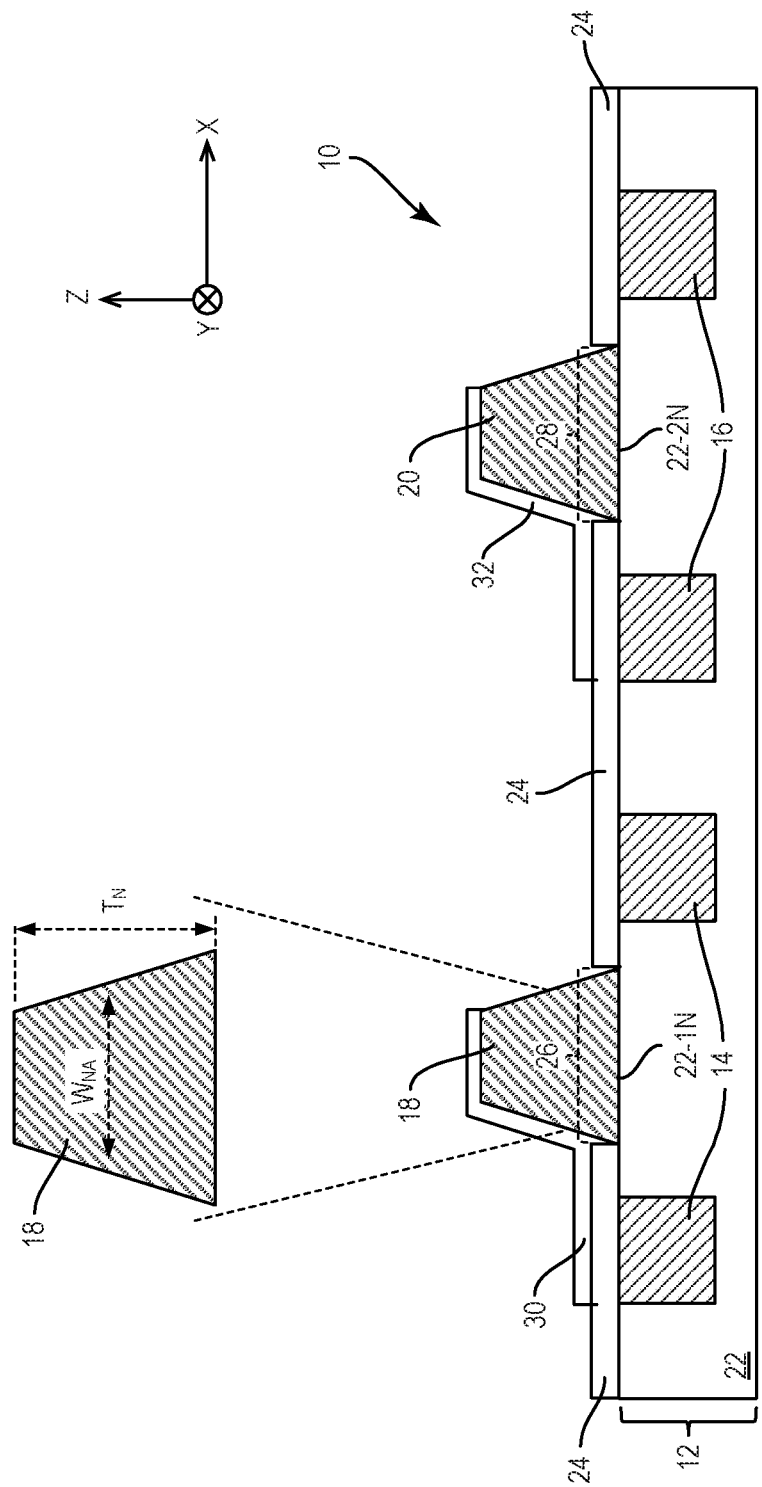

FIGS. 1A and 1B illustrate an exemplary nanowire structure according to one embodiment of the present disclosure.

Figure 2:
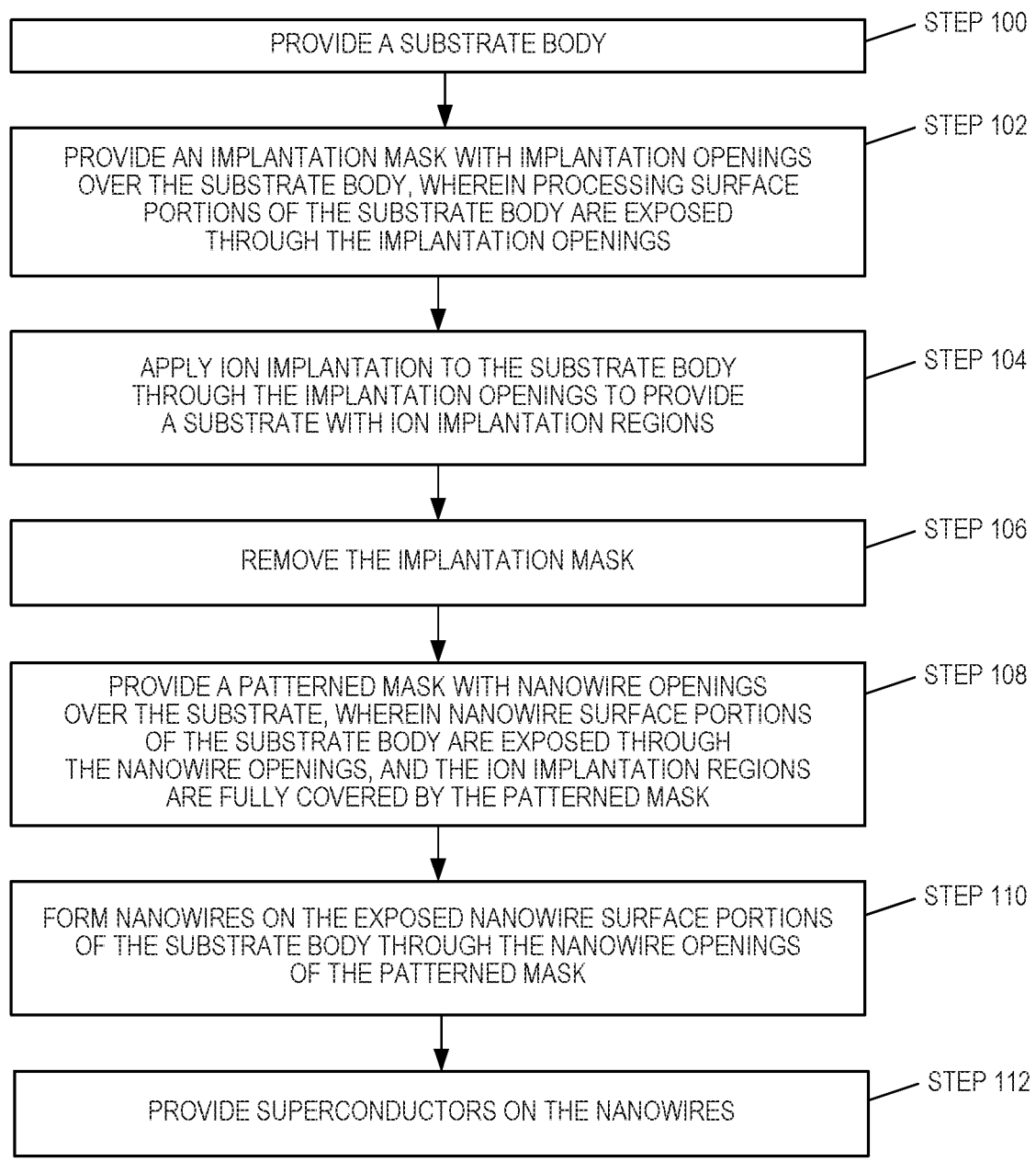

FIG. 2 provides a flow diagram that illustrates an exemplary method for manufacturing a nanowire structure according to one embodiment of the present disclosure.

FIGS. 3-9 illustrate the steps associated with the manufacturing process provided in FIG. 2.

It will be understood that for clear illustrations, FIGS. 1-9 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a selective-area-growth (SAG) nanowire structure with an ion implanted substrate and a process for making the same. FIGS. 1A and 1B provide an exemplary nanowire structure 10 according to one embodiment of the present disclosure. FIG. 1A shows a top view of the nanowire structure 10, and FIG. 1B shows a cross-sectional view of the nanowire structure 10 along a dotted line A-A'. For the purpose of this illustration, the nanowire structure 10 includes a substrate 12 with a first ion implantation region 14 and a second ion implantation region 16, a first nanowire 18, and a second nanowire 20. The first nanowire 18 and the second nanowire 20 may be confined within the first ion implantation region 14 and the second ion implantation region 16, respectively. In different applications, the nanowire structure 10 may include more nanowires, and the substrate 12 may include more ion implantation regions correspondingly.

In detail, the substrate 12 includes a substrate body 22, the first ion implantation region 14, and the second ion implantation region 16. Herein, the substrate body 22 may be formed of a conducting material, such as indium arsenide (InAs), indium antimonide (InSb), gallium antimonide (GaSb), and Indium gallium arsenide ($InGa_{0.8}As_{0.2}$). The first ion implantation region 14 and the second ion implantation region 16 are electrically insulating and extend from a top surface of the substrate body 22 into the substrate body 22 to prevent electron transmission through the substrate body 22 (more details below). The substrate body 22 may have a thickness between 50 μm and 1000 μm. Each of the first and second ion implantation regions 14 and 16 may have a depth (in Z direction) between 2 nm and 50 μm extending from the top surface of the substrate body 22 into the substrate body 22.

A patterned mask 24 with a first nanowire opening 26 and a second nanowire opening 28 resides over the substrate 12 (shown in FIG. 1B, not in FIG. 1A). As such, a first nanowire surface portion 22-1N of the top surface of the substrate body 22 and a second nanowire surface portion 22-2N of the top surface of the substrate body 22 are exposed through the first nanowire opening 26 and the second nanowire opening 28 of the patterned mask 24, respectively. Notice that the patterned mask 24 fully covers the first ion implantation region 14 and the second ion implantation region 16, therefore, the first ion implantation region 14 and the second ion implantation region 16 are not exposed through the first nanowire opening 26 or the second nanowire opening 28 of the patterned mask 24. The patterned mask 24 may be formed of a dielectric material such as silicon dioxide ($SiO_2$), silicon nitride (SiN), aluminum oxide ($Al_2O_3$), diamond, or the like. The patterned mask 24 may have a thickness between 2 nm and 1000 nm.

Each of the first nanowire 18 and the second nanowire 20 is an elongate member that has a nano-scale width ($W_N$) and a length-to-width ratio of at least 10 or at least 20, and is grown selectively on the substrate body 22 through the patterned mask 24. A non-limiting example of the nanowire 18/20 has an average width ($W_{NA}$) in the range of 10 to 1000 nm, optionally 50 to 100 nm, or 75 to 125 nm. The length ($L_N$) of the nanowire 18/20 may be of the order of micrometers, e.g. at least 1 μm, or at least 10 μm. In addition, a thickness ($T_N$) of the nanowire 18/20 may be between 20 nm and 300 nm. The first nanowire 18 and the second nanowire 20 may be formed of a conductive semiconductor such as indium arsenide (InAs), indium antimonide (InSb), or indium arsenide antimonide (InAsSb).

The first nanowire 18 resides directly over the first nanowire surface portion 22-1N of the substrate body 22 through the first nanowire opening 26 of the patterned mask 24. Since the first nanowire 18 and the substrate body 22 are both formed of conducting materials, a lattice constant of the substrate body 22 and a lattice constant of the first nanowire 18 may be relatively close. Accordingly, defects such as misfit dislocations, slip planes, and stacking faults caused by the lattice constant mismatch will be desirably minor. Similarly, the second nanowire 20 resides directly over the second nanowire surface portion 22-2N of the substrate body 22 through the second nanowire opening 28 of the patterned mask 24. Since the second nanowire 20 and the substrate body 22 are both formed of conducting materials, the lattice constant of the substrate body 22 and a lattice constant of the second nanowire 20 may be relatively close, which leads to acceptable misfit dislocations, slip planes, and stacking faults. If the substrate body 22 is formed of an insulating material, a high lattice constant mismatch may occur between the nanowire 18/20 and the substrate body 22. As a result, the first nanowire 18 and/or the second nanowire 20 may not function properly.

In quantum computing, the nanowires are utilized to host and transmit quantum states emerging from the electrons in the structure, which are desired to move consistently and uniformly. Therefore, each surface of the nanowire is desired to be smooth. Since the first nanowire 18 is formed directly over the first nanowire surface portion 22-1N of the substrate body 22 and the second nanowire 20 is formed directly over the second nanowire surface portion 22-2N of the substrate body 22, the first nanowire surface portion 22-1N and the second nanowire surface portion 22-2N of the substrate body 22 are desired to be planarized with vertical roughness below 10 Å.

Note that the first nanowire 18 and the second nanowire 20 are only in contact with the first nanowire surface portion 22-1N and the second nanowire surface portion 22-2N, respectively, but not in contact with the first ion implantation region 14 or the second ion implantation region 16 (the first ion implantation region 14 and the second ion implantation region 16 are fully covered by the patterned mask 24). Therefore, a lattice constant of the first ion implantation region 14 or the second ion implantation region 16, which may be largely different from the lattice constant of the nanowire 18/20, will not cause defects in the growth of the nanowire 18/20.

Each of the first ion implantation region 14 and the second ion implantation region 16 may form a closed loop in an X-Y plane (X-direction, Y-direction, and Z direction are orthogonal to each other). The first nanowire 18 is confined within the first ion implantation region 14, and the second nanowire 20 is confined within the second ion implantation region 16. As such, the first ion implantation region 14 and the second ion implantation region 16 break a conducting path within the substrate 12 between the first nanowire 18 and the second nanowire 20. The first nanowire 18 and the second nanowire 20 are electrically isolated from each other. If the first ion implantation region 14 and the second ion implantation region 16 do not exist, there will be a conducting path through the substrate body 12 (formed of a conducting material) between the first nanowire 18 and the second nanowire 20. As a result, the first nanowire 18 and/or the second nanowire 20 may not function properly. When the first nanowire 26 and the second nanowire 28 have a different shape and/or length, the first ion implantation region 14 and the second ion implantation region 16 may have different shapes. In addition, the first ion implantation region 14 and the second ion implantation region 16 may have different depths.

In addition, the nanowire structure 10 may further include a first superconductor 30 and a second superconductor 32. The first superconductor 30 resides over the first nanowire 18 and optionally over a portion of the patterned mask 24, while the second superconductor 32 resides over the second nanowire 20 and optionally over another portion of the patterned mask 24. The first superconductor 30 and the second superconductor 32 may be not connected. Each of the first superconductor 30 and the second superconductor 32 may be formed of aluminum (Al), lead (Pb), niobium indium (NbIn), tin (Sn), or vanadium (V), with a thickness between 3 nm and 30 nm.

FIG. 2 provides a flow diagram that illustrates a method for manufacturing the nanowire structure 10 according to one embodiment of the present disclosure. FIGS. 3-9 illustrate the steps associated with the manufacturing process provided in FIG. 2. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 3-9.

Figure 3:
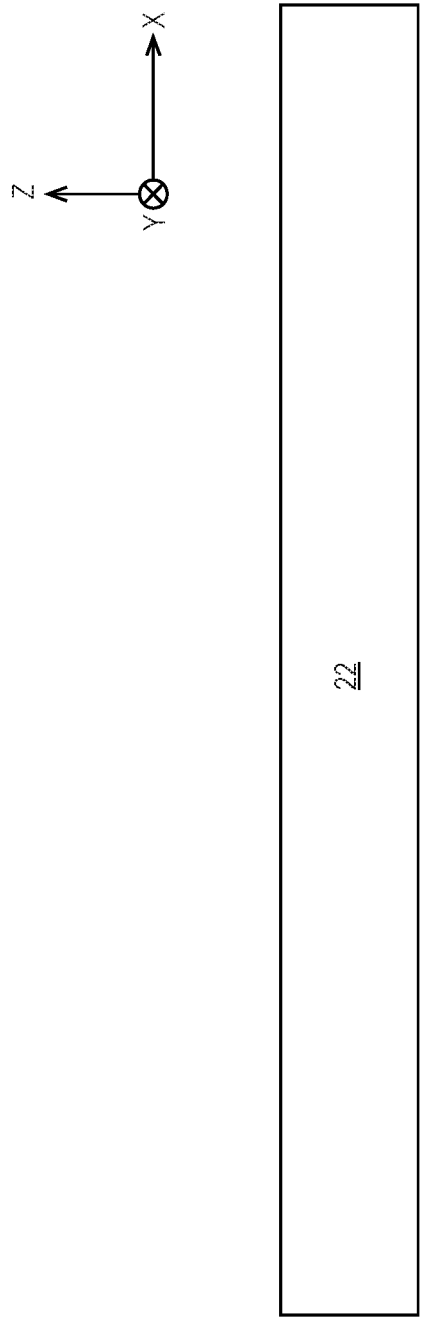
Figure 4:
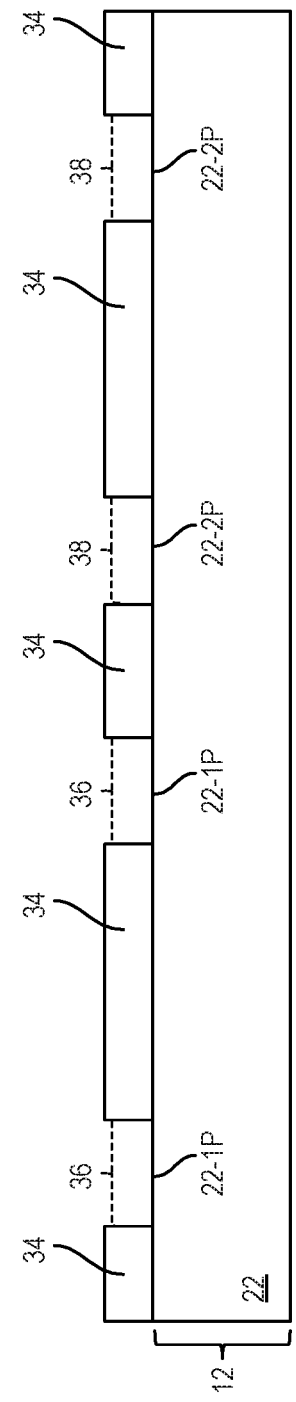

Initially, the substrate body 22 is provided as depicted in FIG. 3 (step 100). The substrate body 22 may be formed of a conducting material, such as InAs, InSb, GaSb, and $InGa_{0.8}As_{0.2}$. The substrate body 22 may have a thickness between 50 µm and 1000 µm. An implantation mask 34 with a first implantation opening 36 and a second implantation opening 38 is provided on the substrate body 22 as depicted in FIG. 4 (step 102). Each of the first implantation opening 36 and the second implantation opening 38 may have a closed-loop shape in the X-Y plane (not shown). The implantation mask 34 may be formed of a polymer like photoresist or polymethyl methacrylate (PMMA) with a thickness between 100 nm and 5 µm. Providing the implantation mask 34 on the substrate body 22 may include providing an implantation mask layer on an entire top surface of the substrate body 22 then patterning the implantation mask layer by any suitable process to provide the implantation mask 34 with the first implantation opening 36 and the second implantation opening 38.

Herein, the first implantation opening 36 and the second implantation opening 38 are designed for a following ion implantation process. A first processing surface portion 22-1P of the substrate body 22 is exposed through the first implantation opening 36, and a second processing surface portion 22-2P of the substrate body 22 is exposed through the second implantation opening 38. Each of the exposed first processing surface portion 22-1P and the exposed second processing surface portion 22-2P of the substrate body 22 may have a closed-loop shape in the X-Y plane (not shown).

Figure 5:
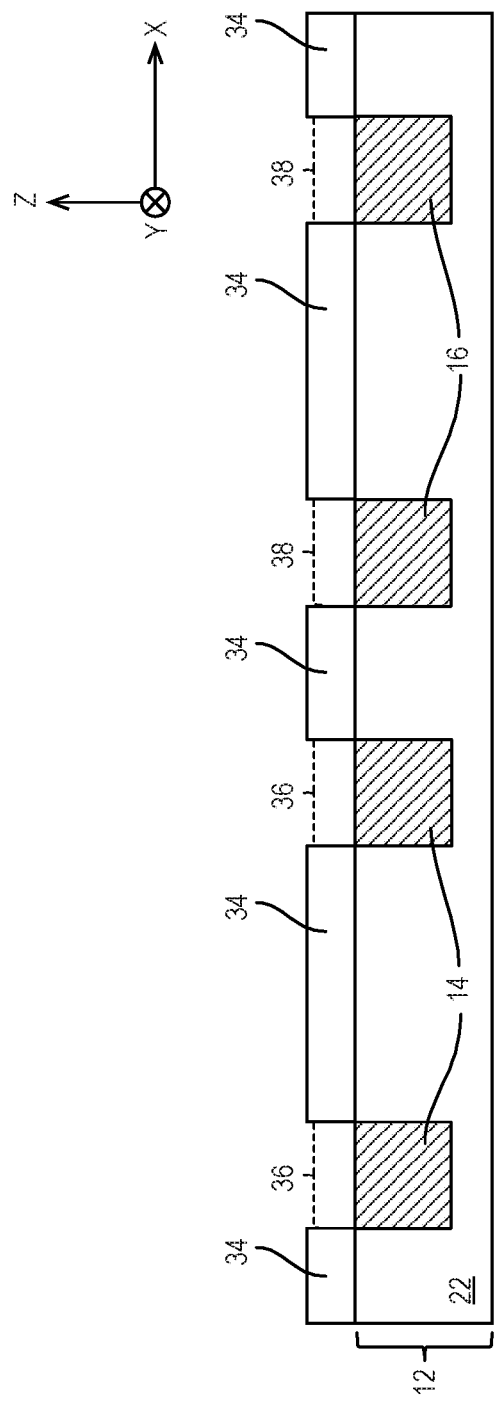

Next, ion implantation is applied to the substrate body 22 to provide the substrate 12 with the first ion implantation region 14 and the second ion implantation region 16, as depicted in FIG. 5 (step 104). In a non-limiting example, the ion implantation process may be implemented by implanting oxygen ions into the substrate body 22. The oxygen implantation into the conducting substrate body 22 will create electron traps, which suppress local conductivity. Because of the implantation mask 34, the ion implantation process is only applied to the substrate body 22 through the first implantation opening 36 and the second implantation opening 38. As such, a portion of the substrate body 22, which extends from the exposed first processing surface portion 22-1P into the substrate body 22, is converted to the first ion implantation region 14 as a conductivity barrier. Another portion of substrate body 22, which extends from the exposed second processing surface portion 22-2P into the substrate body 22, is converted to the second ion implantation region 16 as a conductivity barrier. Each of the first ion implantation region 14 and the second ion implantation region 16 may have a closed-loop shape in the X-Y plane (not shown). Due to different implantation parameters, such as energy, different ion currents, does and/or different annealing parameters, the depth of each ion implantation region 14/16 (in the Z direction) can be controlled, for instance between 2 nm and 50 µm.

Figure 6:
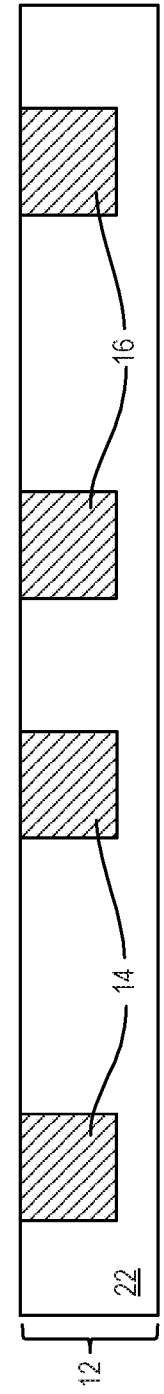
Figure 7:
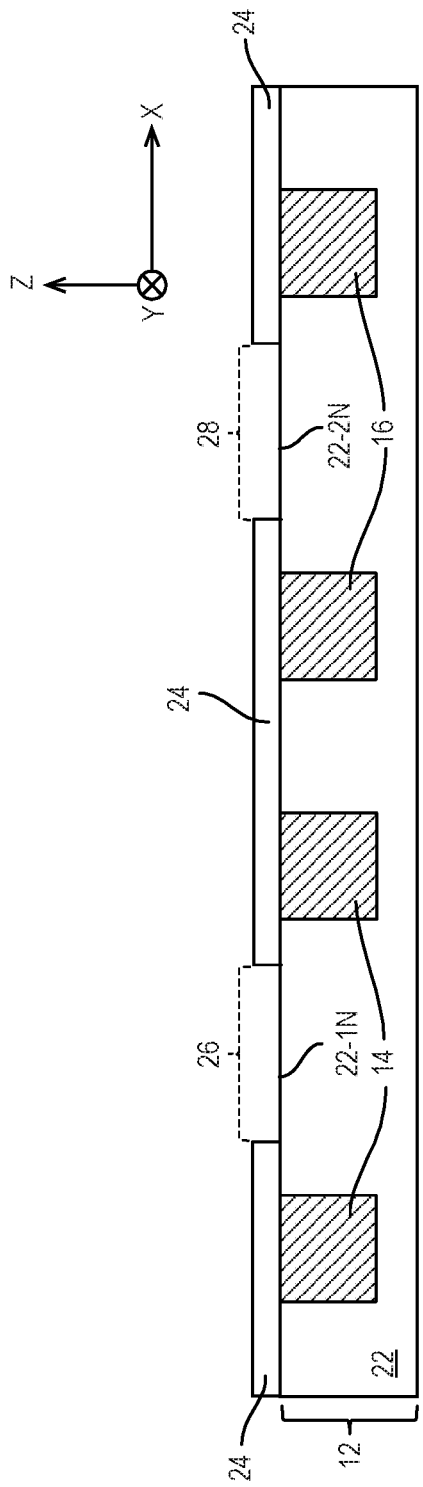

The implantation mask 34 is then removed (step 106) as illustrated in FIG. 6. Optionally, there might be a polishing process followed to clean the substrate 12 and/or to planarize a top surface of the substrate 12 (including a top surface of the substrate body 22 and top surfaces of the ion implantation region 14 and 16). The patterned mask 24 with the first nanowire opening 26 and the second nanowire opening 28 is provided on the substrate 12 (step 108), as illustrated in FIG. 7. The patterned mask 24 may be formed of a dielectric material such as $SiO_2$, SiN, $Al_2O_3$, diamond or any material which inhibits proper epitaxial growth and maintains selectivity. The patterned mask 24 may have a thickness between 2 nm and 1000 nm. Providing the patterned mask 24 on the substrate 12 may include providing a mask layer on the entire top surface of the substrate 12 then patterning the mask layer by any suitable process (such as a lithographic process) to provide the patterned mask 24 with the first nanowire opening 26 and the second nanowire opening 28.

Herein, the patterned mask 24 is designed for following nanowire growth. The first ion implantation region 14 and the second ion implantation region 16 are not desired bases for nanowire growth, because their lattice constant may have a relatively large mismatch with the lattice constant of the nanowires 18 and 20 formed later. As such, the patterned mask 24 is designed to fully cover the first ion implantation region 14 and the second ion implantation region 16. Consequently, the following nanowire growth will not occur directly over the first ion implantation region 14 or the second ion implantation region 16. The first nanowire surface portion 22-1N and the second nanowire surface portion 22-2N of the substrate body 22 are exposed through the first nanowire opening 26 and the second nanowire opening 28 of the patterned mask 24, respectively. The first nanowire opening 26 is designed to be confined within the first ion implantation region 14, such that a nanowire grown on the first nanowire surface portion 22-1N through the first nanowire opening 26 is confined within the first ion implantation region 14. The second nanowire opening 28 is designed to be confined within the second ion implantation region 16, such that a nanowire grown on the second nanowire surface portion 22-2N through the second nanowire opening 28 is confined within the second ion implantation region 16.

Figure 8:
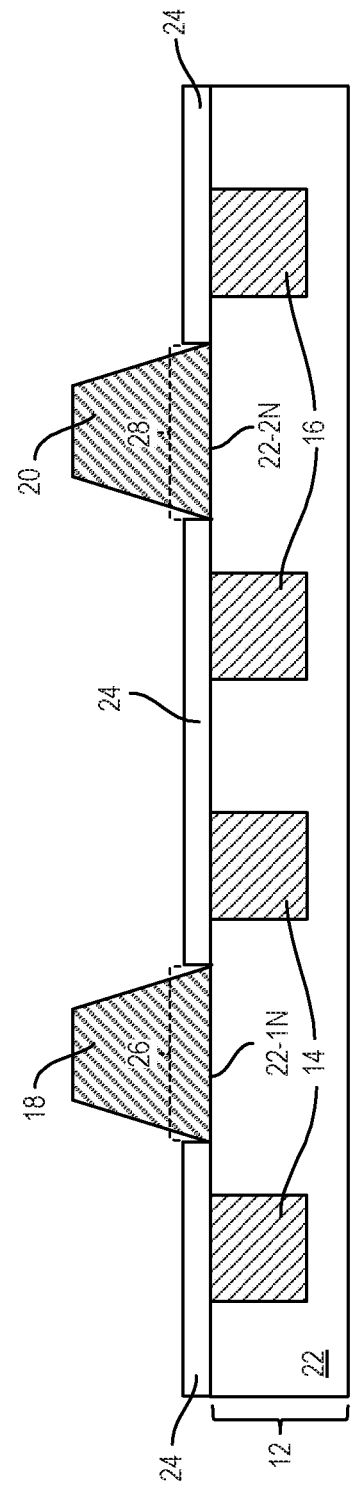

After the patterned mask 24 is formed, the first nanowire 18 and the second nanowire 20 are formed (step 110), as illustrated in FIG. 8. The first nanowire 18 is grown on the first nanowire surface portion 22-1N of the substrate body 22 through the first nanowire opening 26, while the second nanowire 20 is grown on the second nanowire surface portion 22-2N of the substrate body 22 through the second nanowire opening 28. Since the first nanowire 18, the second nanowire 20, and the substrate body 22 are formed of conducting materials, the lattice constant mismatch between the substrate body 22 and the first nanowire 18 and the lattice constant mismatch between the substrate body 22 and the second nanowire 20 are relatively small. Accordingly, defects such as misfit dislocations, slip planes, and stacking faults caused by the lattice constant mismatches will be desirably minor.

Furthermore, since the first nanowire opening 26 is confined within the first ion implantation region 14, the first nanowire 18 grown through the first nanowire opening 26 is also confined within the first ion implantation region 14. Similarly, the second nanowire 20 is confined within the second ion implantation region 16. It is clear that a portion of the first ion implantation region 14 and a portion of the second ion implantation region 16 are positioned between the first nanowire 18 and the second nanowire 20, so as to break the conducting path between the first nanowire 18 and the second nanowire 20 through the substrate body 22. Therefore, the first nanowire 18 and the second nanowire 20 are electrically isolated from each other.

Figure 9:
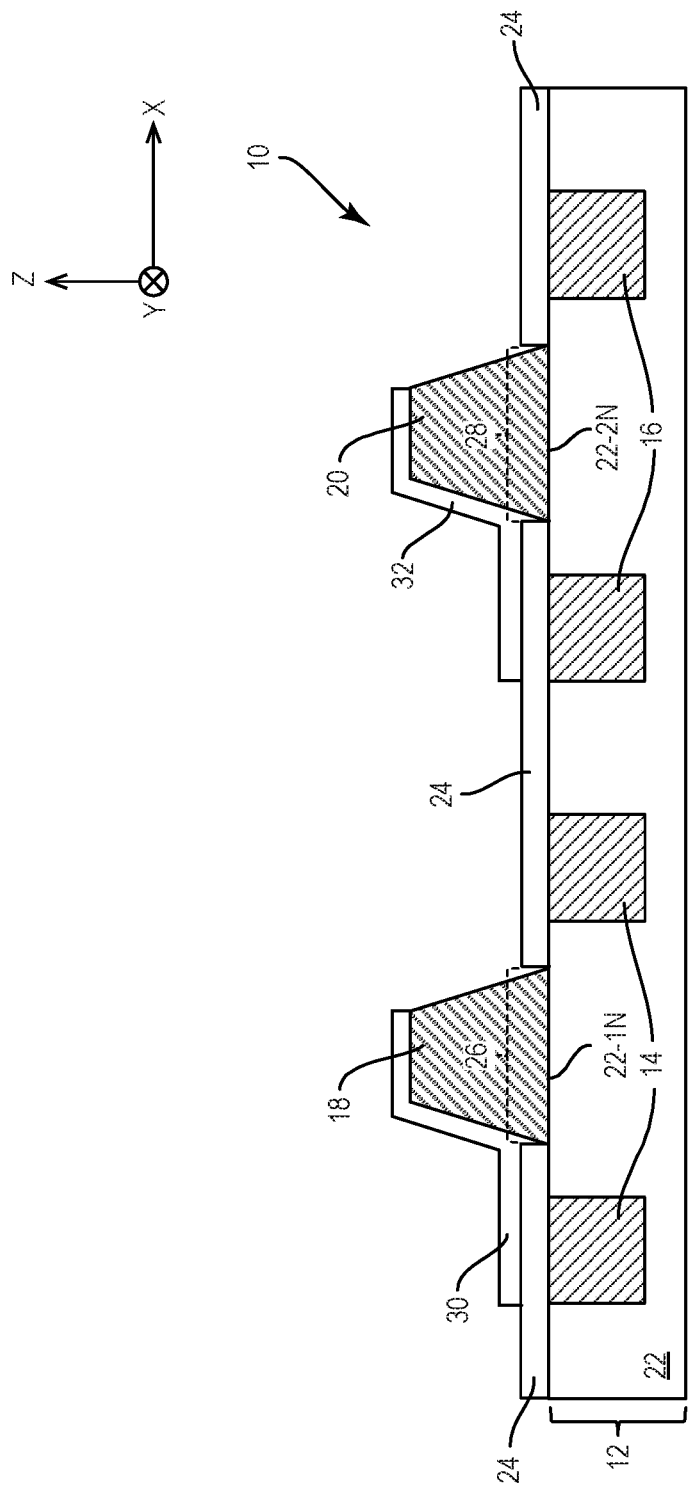

Lastly, the first superconductor 30 and the second superconductor 32 are provided to complete the nanowire structure 10 (step 112) as illustrated in FIG. 9. The first superconductor 30 is formed over the first nanowire 18, and, optionally, on a portion of the patterned mask 24. The first superconductor 30 may not cover the entire first nanowire 18. The second superconductor 32 is formed over the second nanowire 20, and, optionally, on another portion of the patterned mask 24. The second superconductor 32 may not cover the entire second nanowire 20. The first superconductor 30 and the second superconductor 32 may be not connected. In some applications, the first superconductor 30 and the second superconductor 32 may be formed continuously as a continuous film layer over the entire patterned mask 24, the first nanowire 18, and the second nanowire 20 (not shown). Optionally, the continuous film layer may be patterned to separate the first nanowire 18 and the second nanowire 20 (not shown).

Those skilled in the art will recognize improvements and modifications to the preferred embodiments of the present disclosure. All such improvements and modifications are considered within the scope of the concepts disclosed herein and the claims that follow.

What is claimed is:

1. A nanowire structure comprising:
   a substrate including a substrate body and an ion implantation region, wherein:
   the substrate body is formed of a conducting material; and
   the ion implantation region is electrically insulating and extends from a top surface of the substrate body into the substrate body;
   a patterned mask provided over the substrate, wherein:
   the patterned mask comprises an opening through which a surface portion of the top surface of the substrate body is exposed; and
   the patterned mask fully covers the ion implantation region; and
   a nanowire formed directly over the exposed surface portion of the substrate body through the opening of the patterned mask, wherein:
   the nanowire is not in contact with the ion implantation region; and
   the nanowire is confined within the ion implantation region, such that the ion implantation region is configured to provide a conductivity barrier of the nanowire in the substrate.

2. The nanowire structure of claim 1 wherein:
   the substrate body is formed of one of indium arsenide, indium antimonide, gallium antimonide, and indium gallium arsenide; and
   the nanowire is formed of one of indium arsenide, indium antimonide, and indium arsenide antimonide.

3. The nanowire structure of claim 1 wherein:
   the substrate body has a thickness between 50 μm and 1000 μm; and
   the ion implantation region has a depth between 2 nm and 50 μm.

4. The nanowire structure of claim 1 further comprising a superconductor layer formed over the nanowire.

5. The nanowire structure of claim 1 wherein the ion implantation region has a closed-loop shape.

6. A nanowire structure comprising:
   a substrate including a substrate body and at least one ion implantation region, wherein:
   the substrate body is formed of a conducting material; and
   the at least one ion implantation region is electrically insulating, and extends from a top surface of the substrate body into the substrate body;
   a patterned mask with a first opening and a second opening provided over the substrate, wherein:
   a first surface portion of the top surface of the substrate body is exposed through the first opening of the patterned mask;
   a second surface portion of the top surface of the substrate body is exposed through the second opening of the patterned mask; and
   the patterned mask fully covers the at least one ion implantation region;
   a first nanowire formed directly over the exposed first surface portion of the substrate body through the first opening of the patterned mask; and
   a second nanowire formed directly over the exposed second surface portion of the substrate body through the second opening of the patterned mask, wherein:
   the first nanowire and the second nanowire are not in contact with the at least one ion implantation region; and
   a portion of the at least one ion implantation region is between the first nanowire and the second nanowire, so as to break a conducting path within the substrate between the first nanowire and the second nanowire.

7. The nanowire structure of claim 6 wherein:
   the substrate body is formed of one of indium arsenide, indium antimonide, gallium antimonide, and indium gallium arsenide;
   the first nanowire is formed of one of indium arsenide, indium antimonide, and indium arsenide antimonide; and
   the second nanowire is formed of one of indium arsenide, indium antimonide, and indium arsenide antimonide.

8. The nanowire structure of claim 6 wherein:
   the substrate body has a thickness between 50 μm and 1000 μm; and
   the at least one ion implantation region has a depth between 2 nm and 50 μm.

9. The nanowire structure of claim 6 wherein the at least one ion implantation region comprises a first ion implantation region and a second ion implantation region, wherein:
the first nanowire is confined within the first ion implantation region, such that the first ion implantation region is configured to provide a conductivity barrier of the first nanowire;
the second nanowire is confined within the second ion implantation region, such that the second ion implantation region is configured to provide a conductivity barrier of the second nanowire; and
a portion of the first ion implantation region and a portion of the second ion implantation region are positioned between the first nanowire and the second nanowire.

10. The nanowire structure of claim 9 further comprising a first superconductor layer formed over the first nanowire and a second superconductor layer formed over the second nanowire, wherein the first superconductor layer and the second superconductor layer are not connected.

11. The nanowire structure of claim 9 wherein:
the substrate body has a thickness between 50 μm and 1000 μm;
the first ion implantation region has a depth between 2 nm and 50 μm; and
the second ion implantation region has a depth between 2 nm and 50 μm.

12. The nanowire structure of claim 9 wherein the first ion implantation region has a closed-loop shape and the second ion implantation region has a closed-loop shape.

13. The nanowire structure of claim 9 wherein a depth of the first ion implantation region and a depth of the second ion implantation region are different.

14. The nanowire structure of claim 9 wherein the first ion implantation region and the second ion implantation region have different shapes.

* * * * *